United States Patent
Ohya et al.

(10) Patent No.: US 6,337,288 B1
(45) Date of Patent: Jan. 8, 2002

(54) PROCESS FOR THE PRODUCTION OF ELECTRONIC PARTS

(75) Inventors: Kazuyuki Ohya; Masaki Fujihira; Kazuhiro Otsu; Hideki Kobayashi, all of Tokyo (JP)

(73) Assignee: Mitsubishi Gas Chemical Co., Inc., Tokyo (JP)

( * ) Notice: Subject to any disclaimer, the term of this patent is extended or adjusted under 35 U.S.C. 154(b) by 0 days.

(21) Appl. No.: 09/605,388

(22) Filed: Jun. 28, 2000

(30) Foreign Application Priority Data

Jun. 28, 1999 (JP) .......................................... 11-181519

(51) Int. Cl.⁷ .............................................. H01L 21/31
(52) U.S. Cl. ........................ 438/758; 438/690; 438/715; 438/719; 438/724
(58) Field of Search ................................ 438/758, 690; 501/90; 257/642

(56) References Cited

U.S. PATENT DOCUMENTS

| | | | | |
|---|---|---|---|---|
| 5,981,391 A | * | 11/1999 | Yamada ...................... | 438/690 |
| 6,107,674 A | * | 8/2000 | Zommer ...................... | 257/642 |
| 6,214,755 B1 | * | 4/2001 | Otsuki et al. .................. | 501/90 |
| 6,214,923 B1 | * | 4/2001 | Goto et al. .................. | 524/514 |

* cited by examiner

Primary Examiner—John F. Niebling
Assistant Examiner—Olivia Luk
(74) Attorney, Agent, or Firm—Wenderoth, Lind & Ponack, L.L.P.

(57) ABSTRACT

A method of supporting a semiconductor substrate according to the present invention can be applied to the step of processing the semiconductor substrate at a high temperature of 350° C. or higher, and there is provided a process for the production of electronic parts, comprising the steps of forming semiconductor circuits on one surface (surface A) of a semiconductor substrate (SEC) having a thickness of at least 0.2 mm, supporting the semiconductor substrate on a supporting substrate (BP) by bonding (AS) of said surface A to the supporting substrate (BP), grinding and polishing the exposed other surface (surface B) of the semiconductor substrate (SEC) by a physical method, a chemical method or a method of combination of these methods, to decrease the thickness of the semiconductor substrate (SEC) to less than 0.2 mm, forming semiconductor circuits in the polished surface, to obtain an electronic-circuits-possessing semiconductor substrate (PSE), and peeling (PS) the electronic-circuits-possessing semiconductor substrate (PSE) off from the supporting substrate (BP), wherein the step of grinding and polishing the surface B or the step of forming electronic parts in the surface B includes the step of processing the surface B at a high temperature of at least 350° C., and the bonding (AS) uses a heat-resistant thermoplastic (RF).

7 Claims, No Drawings

PROCESS FOR THE PRODUCTION OF ELECTRONIC PARTS

FIELD OF THE INVENTION

The present invention relates to a process for the production of electronic parts, in which electronic circuits are formed on both the surfaces of a semiconductor substrate, the electronic circuits being for attaining an intended function. More specifically, it relates to a process for the production of electronic parts, which process uses a heat-resistant thermoplastic for supporting a semiconductor substrate on one surface of which electronic circuits are formed, so that the process can be applied to an electronic part production process including the step of processing (polishing and forming circuits on) exposed surfaces of the semiconductor substrate at a high temperature of 350° C. or higher.

PRIOR ART OF THE INVENTION

In recent years, it is increasingly required to decrease electronic machines and equipment in thickness and weight, and these machines and equipment are decreasing in thickness further and further, as is typically found in cellular phones and IC cards.

As a thin printed wiring board, printed wiring boards using a wholly aromatic polyamide paper or a polyimide film as a substrate are increasing in number.

Further, ceramic substrates are also available, and they are required to have a thickness of 0.2 mm or less, or they are required to have a smaller thickness of 0.1 mm, 0.05 mm, 0.03 mm or the like. However, a ceramic is generally hard and not deformable, and it has a defect that it is liable to break when decreased in thickness, unless it is a flexible thin glass sheet. For this reason, a ceramic substrate according to a thin film method has a thickness of 0.2 mm and a size of 50 mm×50 mm as a largest work size.

Similarly, electronic parts per se are decreasing in size according to demands for a decrease in size and higher functions.

With regard to silicon wafers, developments for increasing the work size from 20.32 cm to 30.48 cm are actively under way from the viewpoint of an increase in productivity. However, it is difficult to handle silicon wafers when they are decreased in thickness. Further, there is found no process in which metal-containing electronic circuits are formed on both the surfaces of a substrate at the same time, and in a presently available production process, an electronic circuit is formed on one surface and then an electronic circuit is formed on the other surface. Since the thermal expansion coefficient of metals such as copper and aluminum greatly differs from that of a semiconductor substrate by 10 to $15 \times 10^{-6} K^{-1}$, a substrate warps when the substrate is decreased in thickness, and the substrate may break in some cases.

In the production of an electronic part having a thin semiconductor substrate and electronic circuits formed on both the surfaces of the substrate, therefore, it is required to employ, for example, a method in which semiconductors and other electronic circuit portions whose formation requires high temperatures are formed on one surface (e.g., front surface) of a semiconductor substrate having a general thickness, the substrate is supported by a supporting substrate by attaching the surface (in which semiconductors and other electronic circuit portions are formed) to the supporting substrate, the other surface (reverse surface) is ground and polished to decrease the substrate in thickness, electronic circuits are formed on the reverse surface, the substrate is peeled from the supporting substrate, and the substrate is separated into individual electronic parts.

In the step of forming electronic parts on the reverse surface, processing at a high temperature is not required so long as metallizing is carried out to such an extent that a difference between the thermal expansion coefficients is balanced. However, when semiconductor circuits are formed, a substrate is required to have durability against a high temperature of approximately 350° C. or higher and a vacuum degree at which plasma processing or ion plating can be carried out at such a temperature.

Then, it is required to employ a method in which the thin and fragile semiconductor substrate in which a number of electronic circuit parts are formed is peeled off from the supporting substrate with taking care not to break the substrate, and the substrate is separated into individual electronic parts.

It is therefore required to provide a supporting substrate which can be used in the above steps and can be used repeatedly to some extent and which has a thermal expansion coefficient substantially equivalent to the thermal expansion coefficient of a semiconductor substrate, an adhesive which serves to support the semiconductor substrate on the supporting substrate and which permits peeling the semiconductor substrate off from the supporting substrate, and a method of use of these.

SUMMARY OF THE INVENTION

It is an object of the present invention to provide a method which endures the step of grinding and polishing and the step of processing semiconductor circuits at a temperature of 350° C. or higher and can separate electronic parts. In this object, it is to provide a supporting substrate which endures a repeated use, a method of supporting by bonding and a separation method of, electronic parts.

According to the present invention, there is provided a process for the production of electronic parts, comprising the steps of forming semiconductor circuits in one surface (surface A) of a semiconductor substrate (SEC) having a thickness of at least 0.2 mm, supporting the semiconductor substrate on a supporting substrate (BP) by bonding (AS) of said surface A to the supporting substrate (BP), grinding and polishing the exposed other surface (surface B) of the semiconductor substrate (SEC) by a physical method, a chemical method or a method of combination of these methods, to decrease the thickness of the semiconductor substrate (SEC) to less than 0.2 mm, forming semiconductor circuits in the polished surface, to obtain an electronic-circuits-possessing semiconductor substrate (PSE), and peeling (PS) the electronic-circuits-possessing semiconductor substrate (PSE) off from the supporting substrate (BP), wherein the step of polishing the surface B or the step of forming electronic parts in the surface B includes the step of processing the surface B at a high temperature of at least 350° C., and the bonding (AS) uses a heat-resistant thermoplastic (RF).

In the present invention, preferably, a difference between the thermal expansion coefficient of the semiconductor substrate (SEC) and the thermal expansion coefficient the supporting substrate (BP) is $2\times10^{-6}K^{-1}$ or less, the heat-resistant thermoplastic (RF) is selected from the group consisting of polyimide, polyetherimide, polyamideimide, polyesterimide, polyether ether ketone, polyester and polyamide, the bonding (AS) is carried out by thermal pressing under conditions of a temperature of 150 to 400° C., a pressure of 0.1 to 5 MPa and a time period of 3 to 90 minutes, the peeling (PS) is carried out after treatment with water, an amine or a mixture of water with an amine, an ultrasonic treatment at 28 kHz to 150 kHz is also carried out in combination for the peeling (BS), and the supporting substrate (BP) is a resin composite inorganic substrate prepared by impregnating an inorganic substrate selected from the group consisting of an aluminum nitride-boron nitride (AlN-h-BN) substrate, an aluminum nitride-silicon carbide-boron nitride (AlN—SiC—h—BN) substrate, an alumina-boron nitride ($Al^2O^3$—h—BN) substrate, a substrate made of a β-silicon carbide porous material, an amorphous carbon substrate and a carbon-fiber-reinforced carbon substrate with a heat-resistant resin and curing the resin.

DETAILED DESCRIPTION OF THE INVENTION

The present invention will be explained in detail hereinafter.

Semiconductor Substrate (SEC) Having a Thickness of at least 0.2 mm

The semiconductor substrate (SEC) for use in the present invention is typified by a silicon (Si) wafer. In addition, the semiconductor substrate (SEC) includes a semiconductor substrate containing an element such as germanium (Ge), selenium (Se), tin (Sn) or tellurium (Te), and a semiconductor substrate containing gallium-arsenic (GaAs) or containing other compound such as GaP, GaSb, AlP, AlAs, AlSb, InP, InAs, InSb, ZnS, ZnSe, ZnTe, CdS, CdSe, CdTe, AlGaAs, GaInAs, AlInAs or AlGaInAs.

Supporting Substrate (BP)

The supporting substrate (BP) is required to have durability against a high temperature of at least 350° C., and it is further essentially required to have durability against the step of grinding and polishing such as a lapping step and chemicals used for the pre-treatment and post-treatment for forming electronic circuits. Further, when the supporting substrate (BP) is used, the supporting substrate (BP) is essentially required to have a thermal expansion coefficient substantially equivalent to a thermal expansion coefficient of the semiconductor substrate.

Specifically, the supporting substrate (BP) is selected from an alumina substrate, an aluminum nitride substrate, a silicon carbide substrate, a silicon nitride substrate, a borosilicate glass substrate or various carbon substrates.

In the present invention, the supporting substrate (BP) is preferably a substrate prepared by selecting an inorganic continuously porous substrate having a continuous pore content of at least 0.5% by volume, more preferably 2 to 35% by volume and having an average pore diameter of 0.1 to 10 μm, impregnating the inorganic continuous porous substrate with a heat-resistant resin and curing the heat-resistant resin.

Specifically, the inorganic continuously porous substrate is made of an inorganic material selected from an aluminum nitride-boron nitride (AlN-h-BN), an aluminum nitride-silicon carbide-boron nitride (AlN—SiC—h—BN), zirconium oxide-aluminum nitride-boron nitride ($ZrO_2$-AlN-h-BN), alumina-boron nitride ($Al_2O_3$-h-BN), zirconium oxide-alumina-boron nitride ($ZrO_2$-$Al_2O_3$-h-BN), silicon nitride-boron nitride ($Si_3N_4$-h-BN), alumina-titanium oxide-boron nitride ($Al_2O^3$-$TiO_2$-h-BN), a β-silicon carbide porous material (βSiC), amorphous carbon or carbon-fiber-reinforced carbon.

The heat-resistant resin used for impregnating the inorganic substrate can be selected from those addition-polymerizable or crosslinking heat-resistant aromatic polyfunctional cyanate ester resins disclosed in JP-A-8-244163 and JP-A-9-314732 by the present inventors and some others. Of these, highly heat-resistant silicone resin is particularly preferred as a heat-resistant resin feasible for use at a high temperature of over 350° C.

Before the inorganic substrate is impregnated with the above resin, it is preferred to treat the surface of the inorganic substrate for improving the affinity between the inorganic substrate surface including inner wall surfaces of the continuous pores and the resin. The surface treatment is preferably carried out as follows. A solution of an organometallic compound containing aluminum, titanium or silicon or an organometallic compound which is a prepolymer having a weight average molecular weight less than 10,000, generally, in an organic solvent is prepared, the inorganic substrate is impregnated with the organic solvent solution under vacuum, the impregnated substrate is air-dried to remove the solvent and pre-heated, and the organometallic compound is pyrolyzed at a maximum temperature of 850° C. or lower. (See U.S. Pat. No. 5,686,172).

When the above heat treatment is carried out, the substrate is improved in affinity thereof to the resin to be used for the impregnation, and further, the substrate is remarkably improved in adhesion thereof to the heat-resistant thermoplastic (RF) used for the bonding.

In the present invention, the supporting substrate (BP) can be repeatedly used. That is, the semiconductor substrate (SEC) having circuits formed on both the surfaces thereof is separated from the supporting substrate (BP), the adhesive resin is separated from the supporting substrate (BP), and the supporting substrate (BP) is cleaned, re-impregnated, re-ground and re-polished as required and can be used as a supporting substrate again, which is essential in view of effective use and economic performance. Naturally, the above supporting substrate for a re-use may be also applied to a process including no step of processing at a high temperature of at least 350° C.

Heat-resistant Thermoplastic (RF)

A semiconductor substrate (SEC) having electronic circuits formed on one surface thereof is supported on the above supporting substrate (BP) by bonding (AS) of the electronic-circuits-possessing surface of the semiconductor substrate to the supporting substrate (BP), the semiconductor substrate (SEC) is processed in a step of predetermined processing procedures including high-temperature processing at 350° C. or higher, and the semiconductor substrate (SEC) is peeled off, whereby semiconductor parts are produced.

The bonding (AS) is required to be carried out by a method which satisfies the following essential requirements; the supporting substrate (BP) is not to be separated in the step of the predetermined processing procedures, and the semiconductor substrate (SEC) can be easily peeled off after the step of the predetermined processing procedures. Further, it is essentially required to satisfy that the semiconductor substrate (SEC) and the supporting substrate (BP) attached to each other by the bonding (AS) are not to be warped during the step of the predetermined processing procedures due to a difference in thermal expansion coefficient.

In view of the above points, for the bonding (AS) in the present invention, it is preferred to select a heat-resistant thermoplastic (RF). Specifically, the heat-resistant thermoplastic (RF) can be selected from polyimide, polyetherimide, polyamideimide, polyether ketone, polyether ether ketone, polyesterimide, polyester, polyamide, a liquid crystal polymer, polyether sulfone, polysulfone or polyphenylene sulfide.

The method of utilizing these resins for the bonding includes (1) a method using a film having a thickness of 10 to 100 $\mu$m or (2) a method comprising applying a resin solution by a film-forming method such as spin coating and drying the applied resin solution to form a film having a thickness of 20 $\mu$m or less. Preferably, these methods are properly used alone or in combination depending upon a purpose.

The step of using water for the peeling is a useful method. In this case, it is preferred to use a heat-resistant thermoplastic selected from the above heat-resistant thermoplastic having a water-absorption rate of at least 1%.

In view of absorption of a concave and convex shape of electronic parts in which circuits are formed, the thickness of the adhesive resin (RF) is at least 10 $\mu$m, more preferably at least 15 $\mu$m. The maximum thickness of the resin (RF) generally does not exceed 100 $\mu$m since the maximum thickness that can be applied to the processing step is limited in view of the thickness of the supporting substrate.

Processing Step

Electronic circuits are formed on one surface (surface A) of the semiconductor substrate (SEC), and electronic circuits are formed on the other surface (surface B). Generally, the processing step essentially includes the step of processing with a machine, the step of cleaning with an acid and the step of heating at 350° C. or higher.

Step of processing with a machine:

Generally, the semiconductor substrate (SEC) is decreased in thickness and flattened. For this reason, the heat-resistant thermoplastic (RF) is required to have durability against polishing solution for lapping and chemical mechanical polishing (CMP) and mechanical vibration. Further, the heat-resistant thermoplastic (RF) is required to protect the semiconductor circuits from the polishing solution and the mechanical vibration which are accompanied with these steps.

Step of cleaning with an acid:

The heat-resistant thermoplastic adhesive film is required to have durability against a cleaning step using an inorganic acid such as hydrochloric acid, phosphoric acid, nitric acid, sulfuric acid or the like.

Step of heating at 350° C. or higher:

Circuits made of metal thin films are formed, so that the heat-resistant thermoplastic adhesive film is required to have durability against the steps of chemical vapor deposition (CVD) and ion plating. In this case, no force is externally applied. However, the heat-resistant thermoplastic adhesive film is required to be feasible for use at a high temperature under vacuum, and it is required to be almost free from generating outgas.

Naturally, the step of bonding (AS) by pressing under heat approximately at 300 to 400° C. under pressure and the step of separating, generally, with a hot aqueous solution will follow.

Bonding (AS)

In the present invention, the bonding (AS) is required to be effective during at least the above three steps.

For the above reason, in the present invention, the heat-resistant thermoplastic film is used, and the semiconductor substrate (SEC) is generally bonded to, and supported on, the supporting substrate (BP) by hot pressing under reduced pressure at 300 to 400° C. under a pressure of 1 to 80 kg/cm$^2$ (0.1 to 8 MPa), preferably 1 to 50 kg/cm$^2$ (0.1 to 5 MPa), more preferably 5 to 30 kg/cm$^2$ (0.5 to 3 MPa).

There are some heat-resistant thermoplastic films that can be used for bonding at a temperature lower than 300° C. but have no durability against the heating step at a temperature of 350° C. or higher. While the bonding at a higher temperature results in better results, a high temperature exceeding 400° C. is generally not required.

Method of Separation (peeling)

The semiconductor substrate (SEC) having circuits formed and the supporting substrate (BP) are separated from each other by a method in which the semiconductor substrate (SEC) and the supporting substrate (BP) which are attached to each other by bonding (AS) are immersed in water, an amine or a mixture solution of water and an amine. When ultrasonic treatment is used in combination, the time period for the separation is decreased. Heating (25° C. to 140° C.) is preferred for improving absorption of water. While the water may be water generally available, it is preferred to use pure water in view of infiltration and prevention of contamination of the substrate.

The amine can be selected from various amines such as aliphatic amines, aromatic amines and heterocyclic amines, and these amines are preferably soluble in water and hot water. The aliphatic amines include methylamine, tert-butylamine, sec-butylamine, n-butylamine, n-propylamine, isopropylamine, dimethylamine, diethylamine, triethylamine, diethanolamine and 2,5-dimethyl-2,5-hexamethylenediamine. The aromatic amines include aniline, diphenylamine, xylenediamine, dimethylaniline and p-toluidine. Further, other compounds such as ammonia, 1,6-dicyanohexane and morpholine may be used.

A hydrazine/KOH solution, which is often used for etching a polyimide film, shows a very high peeling rate. Since, however, it corrodes silicone, etc., generally, it cannot be used. However, it may be used as a remarkably excellent peeling medium depending upon some semiconductor substrate and some surface treatment thereof.

For the ultrasonic treatment, 28 to 150 kHz may be used. Generally, 50 to 100 kHz is easy to use. The ultrasonic treatment is preferably carried out under heat at 40 to 80° C. When the ultrasonic treatment is carried out for a long period of time, it is required to discontinue the treatment pulsatively so as to prevent an excess increase in temperature.

Concerning the order of separation of the supporting substrate (BP) and the semiconductor substrate (SEC) having circuits formed, the semiconductor substrate (SEC) is first separated from the heat-resistant thermoplastic (RF) when the semiconductor substrate has been decreased in thickness. When the adhesive resin remains on the semiconductor substrate, the substrate is warped due to a residual stress of the resin. When the semiconductor substrate is warped to a great extent, the electronic-circuit-possessing semiconductor substrate decreased in thickness undergoes cracking and is eventually destroyed.

The electronic-circuits-possessing semiconductor substrate (PSE) is generally cut into chip sizes by a method using a dicing saw having a diamond blade having a blade thickness of 100 $\mu$m or less, while other methods such as a laser, etc., may be used. Further, in the cutting of the electronic-circuits-possessing semiconductor substrate (PSE) into individual chip sizes, a preparatory cut such as a V-cut or a U-cut is properly carried out for preventing the occurrence of chippage due to a cutting failure.

Concerning the above-mentioned peeling, there is a method comprising bonding a tape, such as a tape for peeling or for dicing, to the surface B of the electronic-circuits-possessing semiconductor substrate (PSE), fixing a tool, such as a stainless sheet for dicing, on the tape and peeling the electronic-circuits-possessing semiconductor substrate (PSE) off in this state. The above method is free from a warpage and decreases the occurrence of a breakage. So, the peeled electronic-circuits-possessing semiconductor substrate (PSE) can be used for cutting as it is.

Further, it is one of preferred methods to carry out the peeling after the electronic-circuits-possessing semiconductor substrate (PSE) is cut into individual chip sizes.

In this case, the electronic-circuits-possessing semiconductor substrate (PSE) bonded to the supporting substrate is fixed on a table such as a dicing saw, cut into individual chips and then peeled off. Here, reference point(s) for a cutting position are formed on the electronic-circuits-possessing semiconductor substrate (PSE) in advance, and the reference point(s) are optically read. It is preferred to form reference point(s) on the pattern of the surface A which is a protective surface or on the surface A and to read the reference point(s) optically. There may be used a transmission wavelength band of the semiconductor substrate, e.g., a wavelength of 1.3 μm in the case of a gallium-arsenic substrate or a wavelength of 1 μm in the case of a silicon substrate.

As described above, the present invention uses the heat-resistant thermoplastic for bonding and supporting of the semiconductor substrate having electronic circuits on one surface to/with the supporting substrate, and the present invention can be therefore applied to a method of producing electronic parts which method comprises the step of processing at a high temperature of 350° C. or higher for polishing an exposed surface of the semiconductor substrate and forming electronic circuits on/in the surface.

The step of decreasing the semiconductor substrate in thickness in the present invention can be applied to the preparation of a thin ceramic sheet.

EXAMPLES

The present invention will be explained further in detail with reference to Examples, in which "part" and "%" stand for "part by weight" and "% by weight" unless otherwise specified.

Example 1

Preparation of Supporting Substrate (for electronic circuits)

A disc (thickness 1.0 mm, diameter 153 mm, to be referred to as "AN1" hereinafter) made of an aluminum nitride-boron nitride porous sintered body (h-BN 13%, bulk density 2.45, true porosity 20.6 vol %, average pore diameter 0.66 βm) was prepared.

A solution (to be referred to as "Solution M1" hereinafter) of 5 Parts of aluminum tris(ethylacetatonate) (trade name: ALCH-TR, supplied by Kawaken Fine Chemicals K.K.) in 20 parts of xylene and 75 parts of isopropyl alcohol was prepared.

AN1 was placed in a muffle furnace, temperature-increased at a rate of 10° C./minute, maintained at 700° C. for 10 minutes and allowed to cool, to remove impurities such as an organic substance in pores.

The above-treated AN1 was placed in a container, and the container with the AN1 in it was placed in a pressure-reducible impregnator. The pressure in the impregnator was reduced to 10 mmHg or lower, Solution M1 was poured into the container, and the AN1 was maintained in the Solution M1 at room temperature for 15 minutes to carry out vacuum impregnation. The impregnated AN1 was air-dried to remove the solvents, placed in the muffle furnace, temperature-increased at a rate of 10° C./minute, maintained at 750° C. for 10 minutes and allowed to cool, to give AN1 having pores on the inner surfaces of which an aluminum oxide was formed (to be referred to as "AN1-T" hereinafter)

A resin solution (to be referred to as "Resin Solution R1" hereinafter) of 40 parts of a ladder silicone oligomer (trade name: Glass Resin GR908 01-NEG, supplied by TV Products, Inc.) in 60 parts of xylene was prepared.

The above-obtained AN1-T was placed in a container, the container with the AN1-T in it was placed in a pressure-reducible impregnator, and the pressure in the impregnator was reduced to 10 mmHg or lower. Then, Resin Solution R1 was poured into the container, and the AN1-T was maintained in the Resin Solution R1 at room temperature for 30 minutes to carry out vacuum impregnation.

The above-obtained impregnated AN1-T was air-dried and placed in a vacuum dryer, and the pressure in the vacuum dryer was reduced to 10 mmHg or lower. The AN1-T was maintained at 150° C. for 30 minutes to remove the solvent, whereby a resin-impregnated AN1-T was obtained. Further, the resin-impregnated AN1-T was impregnated with the resin in the same manner as above, and dried under heat and under vacuum to give a resin-impregnated AN1-T (to be referred to as "AN1-T-R2"hereinafter).

The above AN1-T-R2 was interposed between aluminum plates, and the resultant laminate was placed between hot press plates of a vacuum press machine. The atmosphere in the machine was pressure-reduced to 10 mmHg or lower, and the An1-T-R2 was pressed at a surface pressure of 1.0 kg/cm$^2$ (0.1 MPa), maintained at a temperature of 250° C. for 30 minutes, then, temperature-increased at a rate of 10° C./minute and maintained at 350° C. for 30 minutes to cure the silicon oligomer.

The atmosphere in the machine was opened to atmosphere, the AN1-T-R2 was allowed to cool, and the AN1-T-R2 of which the resin was cured was taken out and surface-polished to give a supporting substrate having a thickness of 1.0 mm and a diameter of 153 mm.

A heat-fusible polyimide film (trade name: Iupilex VT441S, supplied by Ube Kosan K.K.) cut to a circular (thickness 25 μm, diameter 153 mm) was placed on the supporting substrate, and a silicon wafer (thickness 625 μm, diameter 150 mm) was placed thereon.

An aluminum plate/carbon fiber cloth (trade name: Besfite Paper BP-1050A-EP, supplied by Toho Rayon K.K.)/aluminum plate were stacked on each surface, and the so-prepared set was placed between hot plates of a vacuum press machine.

The atmosphere in the vacuum press machine was reduced to 10 mmHg or lower, and then the above set was pressed at a surface pressure of 1.0 kg/cm$^2$. The set was temperature-increased at a rate of 10° C./minute and maintained at 330° C. for 20 minutes. Then, the atmosphere in the machine was opened to atmosphere, and the set was allowed to cool, whereby the silicon wafer was attached to the supporting substrate.

Process Test

While a disc made of iron having a weight of 3 kg was placed on the supporting substrate to which the silicon wafer was attached, a 2 Hz vibration was exerted on the supporting substrate for 1 hour.

Then, a 20% sulfuric acid aqueous solution was sprayed to the entire surface of the silicon wafer, and the supporting substrate with the silicon wafer attached thereto was treated at 25° C. for 20 minutes. Then, the supporting substrate with the silicon wafer attached thereto was cleaned by spraying pure water at 25° C. for 1 minute, then dried with hot air at 120° C. for 3 minutes and further dried at 150° C. for 10 minutes.

Further, the supporting substrate with the silicon wafer attached thereto was maintained in a muffle furnace, which was set at 400° C., for 15 minutes. In this case, the supporting substrate to which the silicon wafer was attached was found to undergo no warpage in the furnace.

The supporting substrate with the silicon wafer attached thereto was taken out of the furnace, allowed to cool to room temperature, and observed on a base plate for a warpage to show a warpage of 0.0 mm or that no warpage was measurable. Further, no peeling was observed between the silicon wafer and the supporting substrate.

Peeling of Silicon Wafer

The supporting substrate with the silicon wafer attached thereto was placed in a container, immersed in hot water at 60° C. and ultrasonically treated with an ultrasonic cleaning machine (trade name: BR ANSON model 5200, supplied by Yamato Kagaku K.K., 120 W, 47 kHz, 9.5 L) for 1 hour. In this case, no infiltration of water was found, and in this state, the supporting substrate was not at all peeled off.

When a twisting stress was applied to the ultrasonically treated supporting substrate with the silicon wafer attached thereto, the silicon wafer was easily peeled off from the polyimide film.

Example 2

A supporting substrate with a silicon wafer attached thereto was prepared in the same manner as in Example 1 except that the disc for the supporting substrate was replaced with a disc having a diameter of 153 mm and having 12 holes which had a diameter of 1 mm each and were made in a circumference having a diameter of 146 mm at regular intervals and that the polyimide film was replaced with a polyimide film having a diameter of 145 mm.

The supporting substrate with the silicon wafer attached thereto was immersed in hot water at 60° C. and ultrasonically treated for 1 hour, and then the silicon wafer was pushed with pins through the holes made in the supporting substrate. In this case, the silicon wafer was easily peeled off from the polyimide film.

Example 3

A supporting substrate with the silicon wafer attached thereto was prepared in the same manner as in Example 1. The supporting substrate with the silicon wafer attached thereto was immersed in hot water at 60° C. and ultrasonically treated for 1 hour. Then, the supporting substrate was fixed to a table, and the silicon wafer was fixed to a suction pad having an effective diameter of 150 mm by suction and drawn upward. In this case, the silicon wafer was easily peeled off from the polyimide film.

Example 4

A supporting substrate with a silicon wafer attached thereto was prepared in the same manner as in Example 1 except that the disc for the supporting substrate was replaced with a disc having a diameter of 153 mm and having 12 holes which had a diameter of 1 mm each and were made in a circumference having a diameter of 146 mm at regular intervals and that the polyimide film was replaced with a polyimide film having a diameter of 145 mm. The supporting substrate with the silicon wafer attached thereto was immersed in hot water at 60° C. and ultrasonically treated for 1 hour. Then, while the silicon wafer was pushed with pins through the holes made in the supporting substrate, the silicon wafer was fixed to a suction pad having an effective diameter of 150 mm by suction and drawn upward. In this case, the silicon wafer was easily peeled off from the polyimide film.

Comparative Example 1

Example 1 or 2 was repeated except that a supporting substrate with a silicon wafer attached thereto was immersed in water at 30° C. and ultrasonically treated. When an attempt was made to peel of the silicon wafer after the ultrasonic treatment was carried out for 1 hour, the silicon wafer was not at all peeled off even if an external force (twisting force or pushing force with pins) was applied.

Example 5

Example 1 was repeated except that a supporting substrate with a silicon wafer attached thereto was immersed in ethylenediamine at 60° C. and ultrasonically treated. When the ultrasonic treatment is carried out for 50 minutes, the supporting substrate was easily peeled off from the polyimide film without applying any external force.

Example 6

Example 1 was repeated except that a supporting substrate with a silicon wafer attached thereto was immersed in (anhydrous) ethylenediamine at 40° C. and ultrasonically treated. When the ultrasonic treatment is carried out for 3.5 hours, the supporting substrate was easily peeled off from the polyimide film without applying any external force.

Example 7

Example 1 was repeated except that a supporting substrate with a silicon wafer attached thereto was immersed in tetraethylenepentamine at 60° C. and ultrasonically treated. When the ultrasonic treatment is carried out for 1.5 hours, the supporting substrate was mostly peeled off from the polyimide film without applying any external force, but not completely peeled off.

However, when an external force was applied, the supporting substrate was easily peeled off.

Example 8

Example 1 was repeated except that a supporting substrate with a silicon wafer attached thereto was immersed in morpholine at 60° C. and ultrasonically treated. When the ultrasonic treatment is carried out for 4 hours, the supporting substrate was mostly peeled off from the polyimide film without applying any external force, but not completely peeled off.

However, when an external force was applied, the supporting substrate was easily peeled off.

Example 9

Example 1 was repeated except that a supporting substrate with a silicon wafer attached thereto was immersed in monoethanolamine at 60° C. and ultrasonically treated. When the ultrasonic treatment is carried out for 2 hours, the supporting substrate was mostly peeled off from the polyimide film without applying any external force, but not completely peeled off.

However, when an external force was applied, the supporting substrate was easily peeled off.

Example 10

Example 1 was repeated except that AN1 was replaced with a disc (thickness 0.625 mm, diameter 150.8 mm, surface roughness Ra 0.1 µm, parallelism 2 µm, evenness degree 2 µm, to be referred to as "ACN1" hereinafter) made of an aluminum nitride-silicon carbide-boron nitride composite (AlN 76% , SiC 10% , h-BN 13% , others 1% , bulk density 2.37 g/cm$^3$, true porosity 22.2% , average pore diameter 0.76 µm) and that the silicon wafer was cut into chip sizes before peeling the silicon wafer off from the supporting substrate.

The silicon wafer was cut into chip sizes of 3.0×4.0 mm with a diamond blade (blade thickness 20 µm, particle size #3000) by a method comprising setting the supporting substrate on a dicing machine (model DAD 360, supplied by Disco) and reading marks made in the outer regions of the silicon wafer surface facing to the supporting substrate by means of an infrared microscope to adjust a cutting position. Incisions were made so as to reach to the middle of a polyimide film.

The chips obtained by cutting were peeled off by immersing the resultant silicon wafer in pure water having a temperature of 60° C. for 1 hour and then individually applying a twisting stress to each of the chips with a vacuum forceps.

The supporting substrate could be re-used by forcibly peeling the polyimide film bonding thereto off, washing it with water, grinding and polishing it and drying it.

Referential Example 1

Example 1 was repeated except that a supporting substrate with a silicon wafer attached thereto was immersed in a hydrazine-80% monohydrate aqueous solution at 60° C. and ultrasonically treated. When the ultrasonic treatment is carried out for 1 hour, the supporting substrate was peeled off from the polyimide film without applying any external force. However, the silicon wafer was corroded.

Referential Example 2

Example 1 was repeated except that a supporting substrate with a silicon wafer attached thereto was immersed in a mixture containing 30 parts of a hydrazine80% monohydrate aqueous solution and 70 parts of (anhydrous) ethylenediamine at 60° C. and ultrasonically treated. When the ultrasonic treatment is carried out for 1 hour, the supporting substrate was peeled off from the polyimide film without applying any external force. However, the silicon wafer was corroded.

Referential Example 3

Example 1 was repeated except that a supporting substrate with a silicon wafer attached thereto was immersed in a 40% potassium hydroxide aqueous solution at 60° C. and ultrasonically treated. When the ultrasonic treatment is carried out for 30 minutes, peeling took place between the supporting substrate and the polyimide film and between the polyimide film and the silicon wafer without applying any external force. However, the silicon wafer was corroded.

Referential Example 4

Example 1 was repeated except that a supporting substrate with a silicon wafer attached thereto was immersed in a mixture containing 50 parts of a hydrazine-80% monohydrate aqueous solution, 10 parts of potassium hydroxide and 40 parts of water at 60° C. and ultrasonically treated. When the ultrasonic treatment is carried out for 1 hour, the supporting substrate was easily peeled off from the polyimide film without applying any external force. However, the silicon wafer was corroded.

EFFECT OF THE INVENTION

The process for the production of electronic parts, provided by the present invention, can be applied to a process including the step of decreasing a semiconductor substrate by polishing it after electronic circuits are formed on one surface the semiconductor substrate and the surface where the electronic circuits are formed is attached to a supporting substrate, the step of cleaning the semiconductor substrate with an acid and the step using a high temperature of 350° C. or higher. Further, the semiconductor substrate can be easily separated from the supporting substrate. The process of the present invention is therefore highly significant as a highly productive and novel process.

What is claimed is:

1. A process for the production of electronic parts, comprising the steps of
   forming semiconductor circuits on one surface (surface A) of a semiconductor substrate (SEC) having a thickness of at least 0.2 mm,
   supporting the semiconductor substrate on a supporting substrate (BP) by bonding (AS) of said surface A to the supporting substrate (BP),
   grinding and polishing the exposed other surface (surface B) of the semiconductor substrate (SEC) by a physical method, a chemical method or a method of combination of these methods, to decrease the thickness of the semiconductor substrate (SEC) to less than 0.2 mm,
   forming semiconductor circuits on the polished surface, to obtain an electronic-circuits-possessing semiconductor substrate (PSE), and
   peeling (PS) the electronic-circuits-possessing semiconductor substrate (PSE) off from the supporting substrate (BP),
   wherein the step of grinding and polishing the surface B or the step of forming electronic parts in the surface B includes the step of processing the surface B at a high temperature of at least 350° C., and the bonding (AS) uses a heat-resistant thermoplastic (RF).

2. The process according to claim 1, wherein the semiconductor substrate (SEC) and the supporting substrate (BP) have a thermal expansion coefficient difference of $2 \times 10^{-6} K^{-1}$ or less.

3. The process according to claim 1, wherein the heat-resistant thermoplastic (RF) is selected from the group consisting of polyimide, polyetherimide, polyamideimide, polyesterimide, polyether ether ketone, polyester and polyamide.

4. The process according to claim 1, wherein the bonding (AS) is carried out by thermal pressing at a temperature is between 150° C. and 400° C. under a pressure of 0.1 to 5 MPa for 3 to 90 minutes.

5. The process according to claim 1, wherein the peeling (PS) is carried out after treatment in water, an amine or a mixture of water with an amine.

6. The process according to claim 5, wherein ultrasonic treatment at 28 kHz to 150 kHz is carried out in combination with the treatment before the peeling (PS).

7. The process according to claim 1, wherein the supporting substrate (BP) is a resin composite inorganic substrate prepared by impregnating an inorganic substrate selected from the group consisting of an aluminum nitride-boron nitride (AlN-h-BN) substrate, an aluminum nitride-silicon carbide-boron nitride (AlN—SiC-h-BN) substrate, an alumina-boron nitride ($Al^2O^3$-h-BN) substrate, a substrate made of a β-silicon carbide porous material, an amorphous carbon substrate and a carbon-fiber-reinforced carbon substrate with a heat-resistant resin and curing the resin.

* * * * *